(12) United States Patent
Suzuki et al.

(10) Patent No.: US 10,236,319 B2
(45) Date of Patent: Mar. 19, 2019

(54) PHOTODETECTOR AND IMAGING DEVICE

(71) Applicant: FUJITSU LIMITED, Kawasaki-shi, Kanagawa (JP)

(72) Inventors: Ryo Suzuki, Fujisawa (JP); Hiroyasu Yamashita, Isehara (JP); Junichi Kon, Isehara (JP); Hironori Nishino, Isehara (JP)

(73) Assignee: FUJITSU LIMITED, Kawasaki-shi (JP)

( * ) Notice: Subject to any disclaimer, the term of this patent is extended or adjusted under 35 U.S.C. 154(b) by 3 days.

(21) Appl. No.: 15/673,927

(22) Filed: Aug. 10, 2017

(65) Prior Publication Data
US 2018/0053805 A1 Feb. 22, 2018

(30) Foreign Application Priority Data
Aug. 22, 2016 (JP) .................................. 2016-161921

(51) Int. Cl.
*H01L 27/146* (2006.01)
*H01L 31/10* (2006.01)

(52) U.S. Cl.
CPC .. *H01L 27/14669* (2013.01); *H01L 27/14634* (2013.01); *H01L 31/10* (2013.01)

(58) Field of Classification Search
CPC ......... H01L 27/14669; H01L 27/14634; H01L 27/14647; H01L 27/14649; H01L 33/10; H01L 33/08; H01L 33/04; H01L 31/10; H01L 27/14652; H01L 27/14665; H01S 3/0809

See application file for complete search history.

(56) References Cited

U.S. PATENT DOCUMENTS

| | | | | |
|---|---|---|---|---|
| 6,437,414 B1* | 8/2002 | Nishino | ................. | B82Y 20/00 257/440 |
| 6,521,967 B1* | 2/2003 | Bandara | .................... | G01J 5/10 250/339.02 |
| 7,291,858 B2* | 11/2007 | Sundaram | ............. | B82Y 20/00 257/184 |
| 9,129,880 B2* | 9/2015 | Ozaki | ............... | H01L 27/14652 |
| 2002/0027238 A1* | 3/2002 | Lin | ........................ | B82Y 20/00 257/292 |
| 2004/0195509 A1* | 10/2004 | Sundaram | ............. | B82Y 20/00 250/338.1 |
| 2014/0264705 A1* | 9/2014 | Ozaki | ............... | H01L 27/14652 257/443 |

FOREIGN PATENT DOCUMENTS

| | | |
|---|---|---|
| JP | 2010-192815 A1 | 9/2010 |
| JP | 2015-142110 A1 | 8/2015 |

\* cited by examiner

*Primary Examiner* — Latanya N Crawford
(74) *Attorney, Agent, or Firm* — Kratz, Quintos & Hanson, LLP

(57) ABSTRACT

A photodetector includes a lower contact layer, a first absorber layer that is formed over the lower contact layer and that is photosensitive to light of a first wavelength, an middle contact layer formed over the first absorber layer, a second absorber layer that is formed over the middle contact layer and that is photosensitive to light of a second wavelength, and an upper contact layer formed over the second absorber layer, wherein a barrier layer is formed between the lower contact layer and the first absorber layer, between the first absorber layer and the middle contact layer, between the middle contact layer and the second absorber layer, or between the second absorber layer and the upper contact layer.

13 Claims, 20 Drawing Sheets

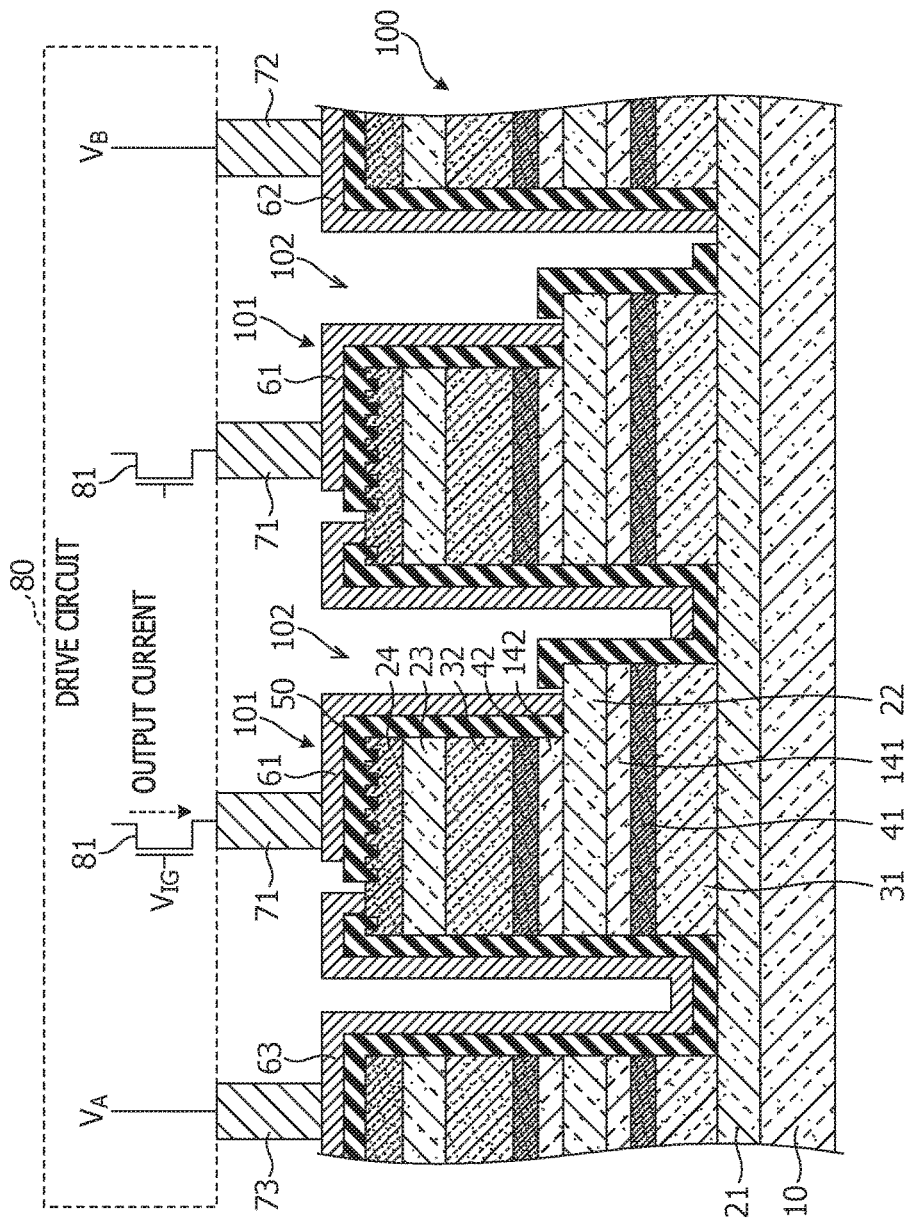

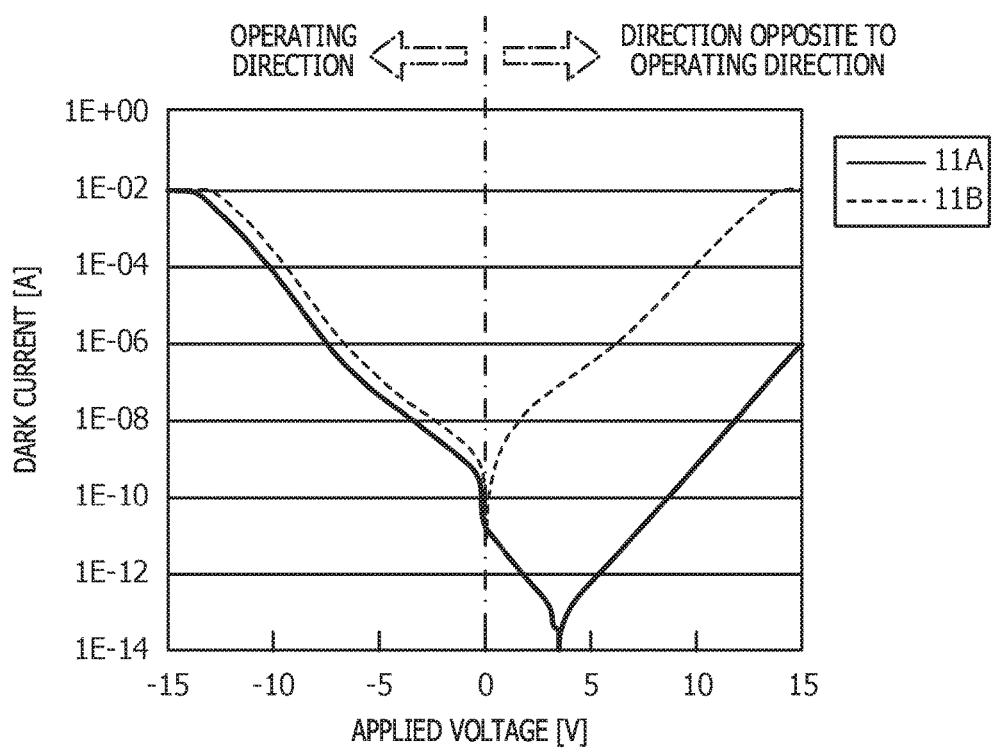

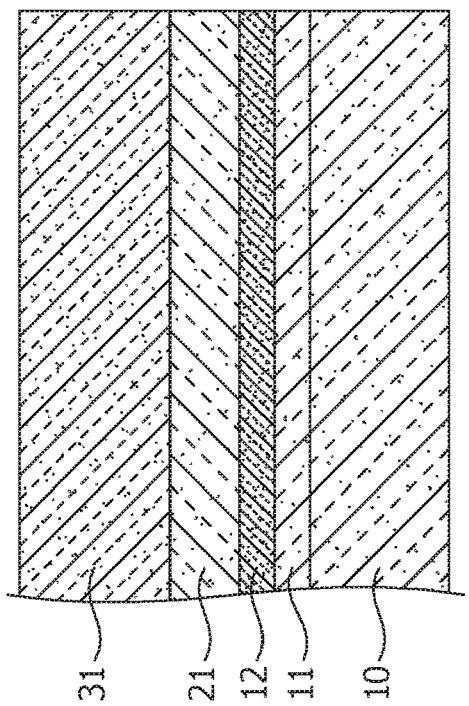
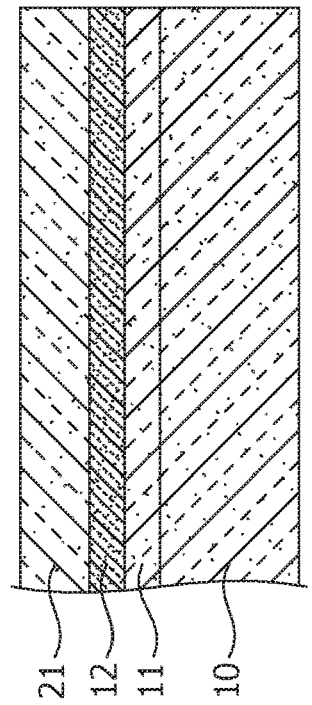

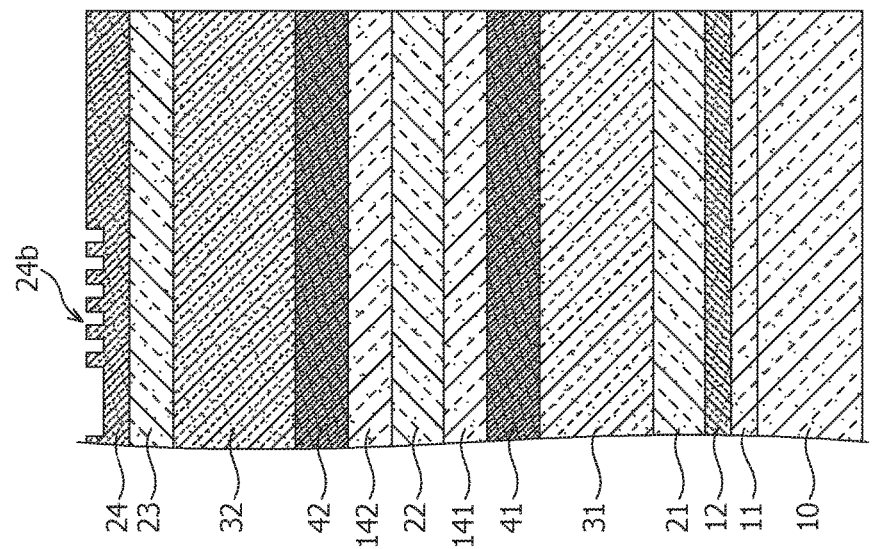
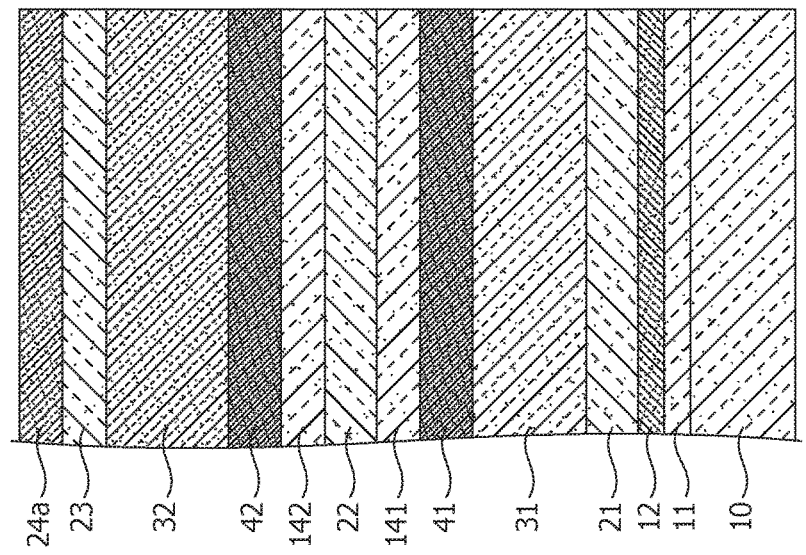

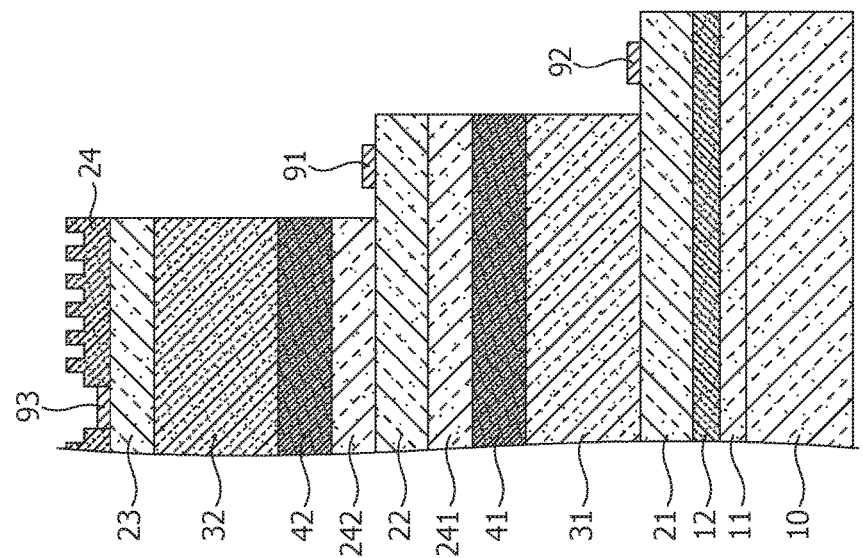
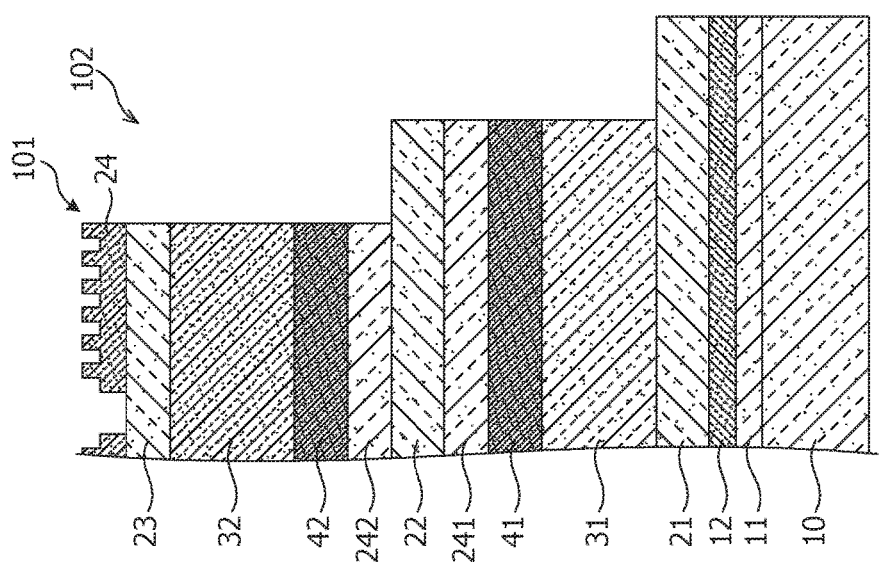

PHOTODETECTOR AND IMAGING DEVICE

CROSS-REFERENCE TO RELATED APPLICATION

This application is based upon and claims the benefit of priority of the prior Japanese Patent Application No. 2016-161921, filed on Aug. 22, 2016, the entire contents of which are incorporated herein by reference.

FIELD

The embodiments discussed herein are related to a photodetector and an imaging device.

BACKGROUND

A two-wavelength infrared photodetector, which is a photodetector, may detect infrared of two different wavelengths. Such a two-wavelength infrared photodetector has pixels that convert infrared signals in two different wavelength regions into electrical signals, is connected to, for example, a drive circuit, and is used, for example, as an infrared image sensor.

In the two-wavelength infrared photodetector, absorber layers that respond to infrared of two different wavelengths are stacked with a contact layer interposed therebetween. The contact layer is connected to the drive circuit. Examples of the photodetector include a quantum well infrared photodetector (QWIP) and a quantum dot infrared photodetector (QDIP). Each absorber layer of the QWIP is formed of multi-quantum well layers. Each absorber layer of the QDIP is formed of quantum dots layers. Carriers bound at a quantum level in a quantum well in the case of the QWIP or in a quantum dot in the case of the QDIP are detected as optical signals in a manner in which the carriers absorb infrared and are extracted from the contact layer.

In recent years, since there has been a demand for an increased number of pixels and improved accuracy in two-wavelength infrared photodetectors, the area of each pixel has decreased. For example, a structure in which a single bump electrode is formed on the pixels is disclosed.

A two-wavelength infrared photodetector including a single bump electrode will be described with reference to FIG. 1. In the two-wavelength infrared photodetector, a lower contact layer 921, a first absorber layer 931, an middle contact layer 922, a second absorber layer 932, an upper contact layer 923, and a coupler layer 924 are formed of compound semiconductors so as to be stacked on a GaAs substrate 910. The lower contact layer 921, the middle contact layer 922, and the upper contact layer 923 are formed of n-GaAs. A diffraction grating is formed on a surface of the coupler layer 924, so that an optical coupling structure is formed. The first absorber layer 931 and the second absorber layer 932 each have multi-quantum well (MQW) structures. The first absorber layer 931 and the second absorber layer 932 are formed so as to be able to detect infrared of different wavelengths.

Pixel-separating grooves 902 are formed to separate pixels 901 from each other. The pixel-separating grooves 902 are formed in a manner in which the coupler layer 924, the upper contact layer 923, the second absorber layer 932, the middle contact layer 922, and the first absorber layer 931 are removed. Part of a surface of the lower contact layer 921, the side surfaces of each pixel 901, and part of the upper surface of the coupler layer 924 are covered by passivation films 950.

In each pixel 901, a wiring line 961 connected to the middle contact layer 922 is formed on the corresponding passivation film 950. The lower contact layer 921 forms a first common electrode and is connected to a wiring line 962 formed on the corresponding passivation film 950. The upper contact layer 923 of each pixel 901 is connected to a wiring line 963 formed on the corresponding passivation film 950 with the coupler layer 924 interposed therebetween and forms a second common electrode.

The two-wavelength infrared photodetector is connected to a drive circuit 980 with bumps 971, 972, and 973 interposed therebetween. The wiring line 961 connected to the middle contact layer 922 formed in each pixel 901 is connected to a transistor 981 of the drive circuit 980 with the bump 971 interposed therebetween. The wiring line 962 connected to the lower contact layer 921 is connected to an electric potential $V_B$ of the drive circuit 980 with the bump 972 interposed therebetween. The wiring line 963 connected to the upper contact layer 923 with the coupler layer 924 interposed therebetween is connected to an electric potential $V_A$ of the drive circuit 980 with the bump 973 interposed therebetween.

The two-wavelength infrared photodetector having the structure illustrated in FIG. 1 may detect infrared of two wavelengths in a manner in which the time in which the first absorber layer 931 operates and time in which the second absorber layer 932 operates are divided. Specifically, an electric potential difference is generated between the lower contact layer 921 and the middle contact layer 922, and the electric potential of the upper contact layer 923 and the electric potential of the middle contact layer 922 are made equal. Thus, carriers that have absorbed infrared of a first wavelength that is incident on the first absorber layer 931 are extracted from the middle contact layer 922. At this time, since the upper contact layer 923 and the middle contact layer 922 have an equal electric potential, no carriers are extracted from the middle contact layer 922 even through infrared of a second wavelength is incident on the second absorber layer 932. In this way, optical signals only through the first absorber layer 931 may be detected.

An electric potential difference is generated between the upper contact layer 923 and the middle contact layer 922, and the electric potential of the lower contact layer 921 and the electric potential of the middle contact layer 922 are made equal. Thus, carriers that have absorbed infrared of the second wavelength that is incident on the second absorber layer 932 are extracted from the middle contact layer 922. At this time, since the lower contact layer 921 and the middle contact layer 922 have an equal electric potential, no carriers are extracted from the middle contact layer 922 even through infrared of the first wavelength is incident on the first absorber layer 931. In this way, optical signals only through the second absorber layer 932 may be detected.

The two-wavelength infrared photodetector having the structure illustrated in FIG. 1 may detect infrared of two different wavelengths in a time division manner, as described above.

In the case where infrared of the first wavelength is detected in the first absorber layer 931, the electric potential of the middle contact layer 922 and the electric potential of the upper contact layer 923 are requested to be equal. The reason is that in the case where the electric potential of the middle contact layer 922 and the electric potential of the upper contact layer 923 are different from each other, a photo current flows due to a difference in electric potential between the middle contact layer 922 and the upper contact layer 923 when infrared of the second wavelength is incident on the second absorber layer 932. Accordingly, in this case, it is difficult to separate the infrared of two different wavelengths. The same is true in the case where infrared of the second wavelength is detected in the second absorber layer 932.

FIG. 2 is a circuit diagram including a pixel of the two-wavelength infrared photodetector and part of the drive circuit 980. The electric potential $V_S$ of the middle contact layer 922 is indirectly determined by the gate potential $V_{IG}$ of the transistor 981 of the drive circuit 980 and a drain current flowing through the transistor 981. Accordingly, electric potentials that can be optionally set from the outside include the electric potential $V_A$ of the upper contact layer 923 and the electric potential $V_B$ of the lower contact layer 921, which are electric potentials of the two common electrodes, and the gate potential $V_{IG}$ of the transistor 981. For this reason, it is difficult to apply an electric potential directly to the middle contact layer 922 for reading signals.

In the case where the pixels 901 are disposed in the two-wavelength infrared photodetector, the characteristics of the first absorber layer 931 and the second absorber layer 932 in each pixel 901 are not the same and are different between the pixels 901. In this case, even when the equal electric potentials $V_A$, $V_B$, and $V_{IG}$ are applied to each pixel 901, the electric potential $V_S$ of the middle contact layer 922 varies between the pixels because differences in the characteristics of the first absorber layer 931 and the second absorber layer 932 in each pixel 901 cause the flowing electric current to vary.

In the case of operation as an imaging device, even if the characteristics of all of the pixels are the same, the amount of incident light varies between the pixels, and generated signals vary between the pixels. For this reason, since the electric potential $V_S$ of the middle contact layer 922 depends on the magnitude of the electric current, the electric potential $V_S$ varies between the pixels.

The electric potential $V_S$ of the middle contact layer 922 thus varies between the pixels, a noise current as described above is made, and it is difficult to sufficiently separate infrared of two different wavelengths.

To solve such a problem, there is disclosed a method for separating infrared of two different wavelengths, for example, in a manner in which the middle contact layer is formed of three semiconductor layers of an n-type layer, a p-type layer, and an n-type layer, and flow guiding by using a pn junction is used. There is also disclosed a method for separating infrared of two different wavelengths in a manner in which barrier layers are formed of a material having a large band gap between the middle contact layer and the first absorber layer and between the middle contact layer and the second absorber layer. This method enables signals of two wavelengths to be easily separated in a manner in which the barrier layers that have a large band gap and are not doped with impurity elements are formed such that no electric current flows in the direction opposite to the direction in which the electric current flows through the first absorber layer and the second absorber layer during operation.

According to the above method, however, compound semiconductor layers such as the barrier layers are formed at a relatively high temperature in the case where the compound semiconductor layers are formed by epitaxial growth. For this reason, when the barrier layers are formed, in some cases, impurity elements with which the middle contact layer is doped segregate to the barrier layers, which are not doped with impurity elements, and the electric current flows in the direction opposite to the direction in which the electric current flows during operation. In this case, it is difficult to stably separate signals of two wavelengths.

For these reasons, there is a demand to stably separate signals of two wavelengths in the two-wavelength infrared photodetector in which the absorber layers are stacked.

The followings are reference documents.

[Document 1] Japanese Laid-open Patent Publication No. 2010-192815 and

[Document 2] Japanese Laid-open Patent Publication No. 2015-142110.

SUMMARY

According to an aspect of the invention, a photodetector includes a lower contact layer, a first absorber layer that is formed over the lower contact layer and that is photosensitive to light of a first wavelength, an middle contact layer formed over the first absorber layer, a second absorber layer that is formed over the middle contact layer and that is photosensitive to light of a second wavelength, and an upper contact layer formed over the second absorber layer, wherein a barrier layer is formed between the lower contact layer and the first absorber layer, between the first absorber layer and the middle contact layer, between the middle contact layer and the second absorber layer, or between the second absorber layer and the upper contact layer, wherein a buffer layer is formed between the lower contact layer and the barrier layer, between the middle contact layer and the barrier layer, or between the upper contact layer and the barrier layer, wherein semiconductor materials of the lower contact layer, the middle contact layer, and the upper contact layer are doped with an impurity element, wherein the barrier layer is formed of a material having a band gap larger than a band gap of the first absorber layer or a band gap of the second absorber layer, and wherein an impurity concentration of the buffer layer is lower than an impurity concentration of the middle contact layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a diagram illustrating the structure of a two-wavelength infrared photodetector according to a first embodiment;

FIG. 11 is a current-voltage characteristic of the two-wavelength infrared photodetector;

FIGS. 13A and 13B are first process diagrams of a method of manufacturing a semiconductor device according to the first embodiment;

FIGS. 17A and 17B are fifth process diagrams of the method of manufacturing the semiconductor device according to the first embodiment;

FIGS. 18A and 18B are sixth process diagrams of the method of manufacturing the semiconductor device according to the first embodiment;

DESCRIPTION OF EMBODIMENTS

Figure 1:
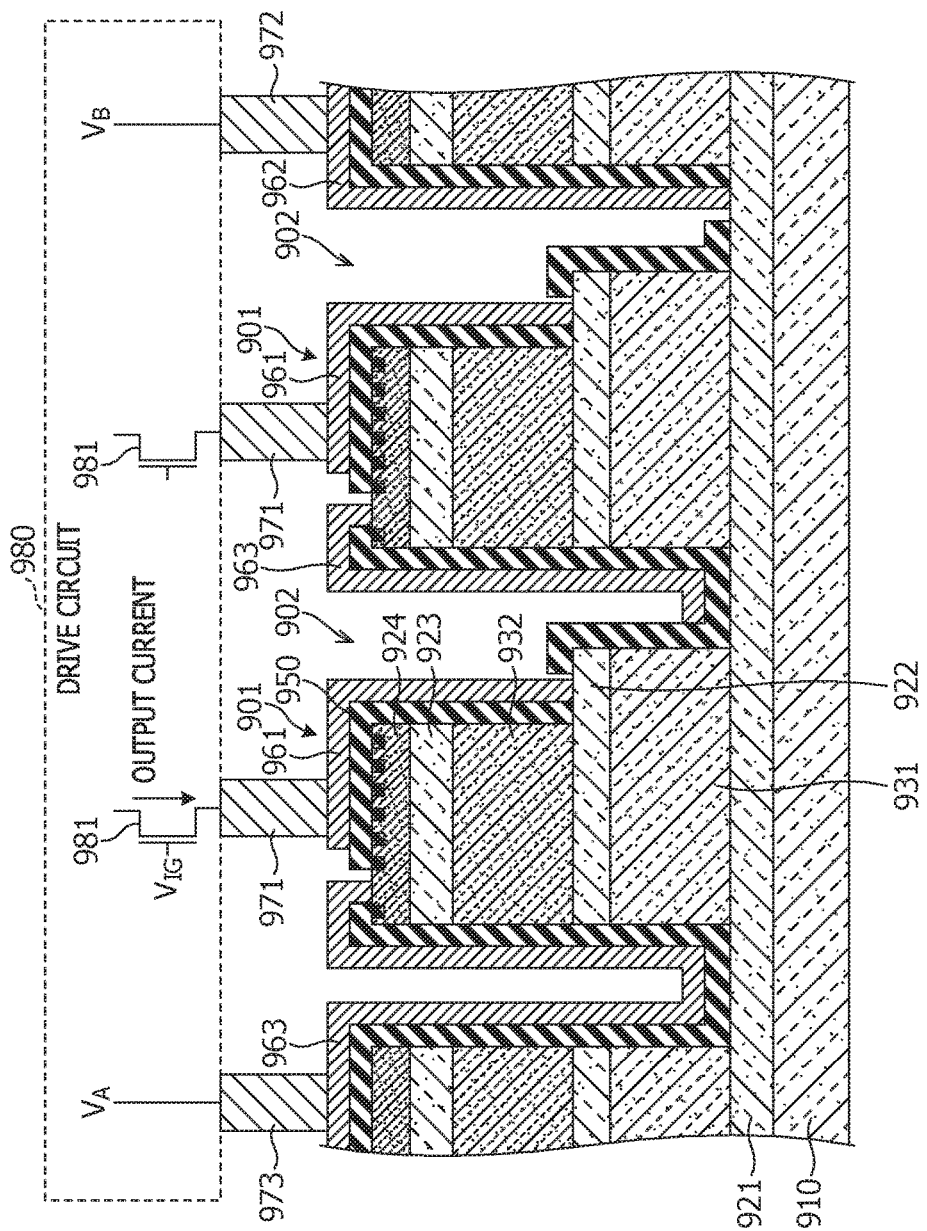
FIG. 1 is a diagram illustrating the structure of a conventional two-wavelength infrared photodetector.
Figure 2:
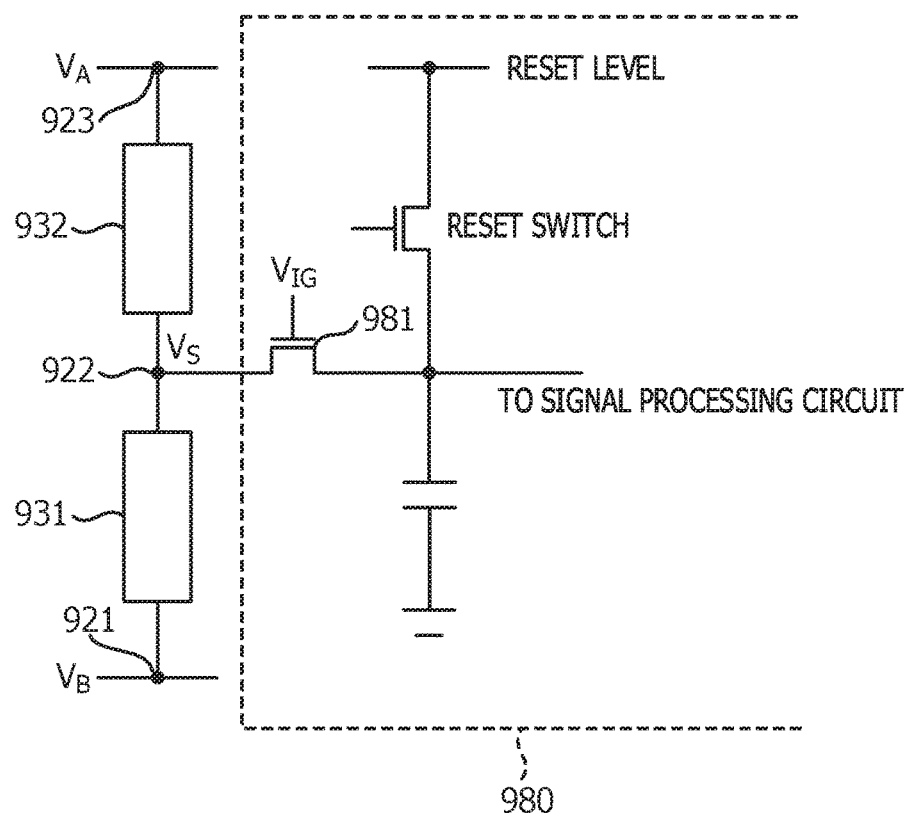
FIG. 2 is an explanatory diagram of the conventional two-wavelength infrared photodetector.

Embodiments will hereinafter be described. Like components are designated by like reference numbers, and a description thereof is omitted. In the drawings, for convenience, the aspect ratio is not accurate in some cases.

First Embodiment

The fact that it is difficult for a two-wavelength infrared photodetector including barrier layers to stably separate signals of two wavelengths will be first described with reference to FIG. 3.

Figure 3:
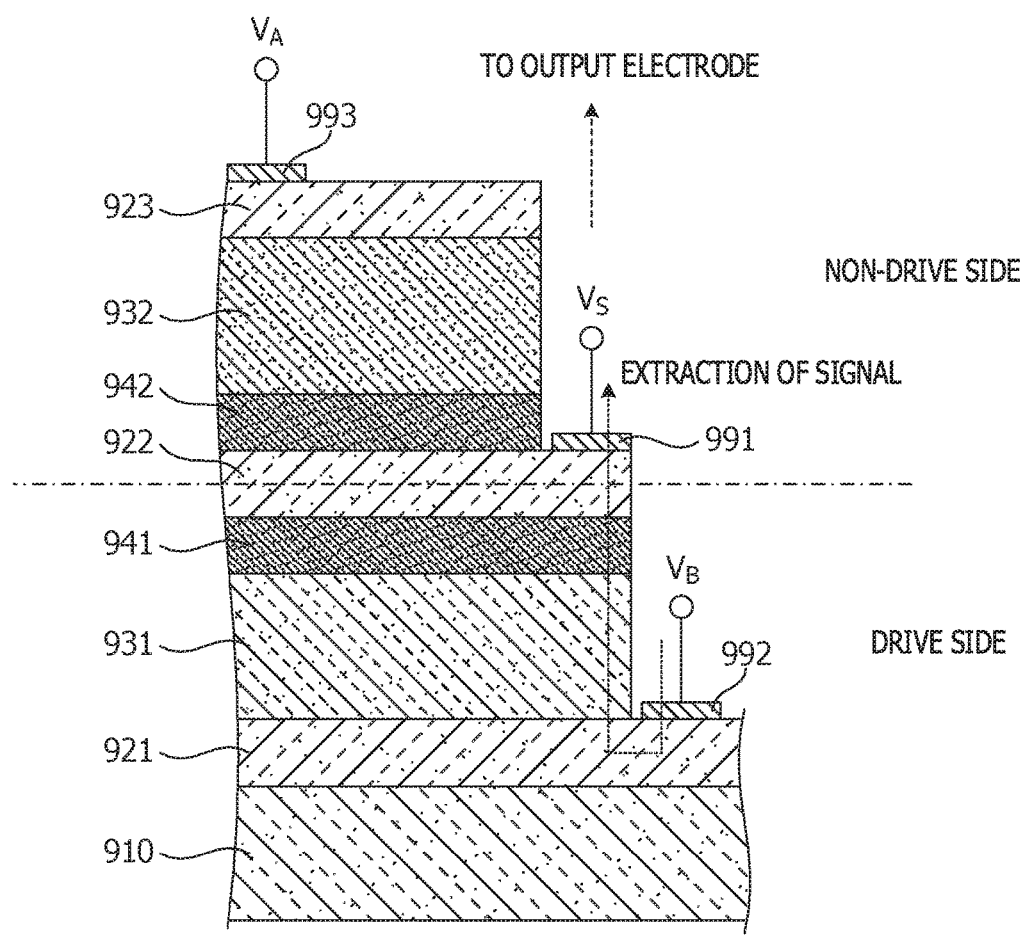
FIG. 3 is a diagram illustrating the structure of a two-wavelength infrared photodetector including barrier layers.

As illustrated in FIG. 3, in the two-wavelength infrared photodetector including the barrier layers, a first barrier layer 941 is formed between the first absorber layer 931 and the middle contact layer 922, and a second barrier layer 942 is formed between the middle contact layer 922 and the second absorber layer 932. A middle electrode 991 is connected to the middle contact layer 922, which is connected to a transistor of a drive circuit, not illustrated. A lower electrode 992 is connected to the lower contact layer 921, to which an electric potential $V_B$ is applied via the lower electrode 992. An upper electrode 993 is connected to the upper contact layer 923, to which an electric potential $V_A$ is applied via the upper electrode 993.

Regarding the two-wavelength infrared photodetector illustrated in FIG. 3, the case where an infrared signal detected in the first absorber layer 931 is extracted will be described. In this case, control is performed such that the electric potential $V_A$ applied to the upper electrode 993 is less than the electric potential $V_S$ of the middle electrode 991.

Figure 4A:
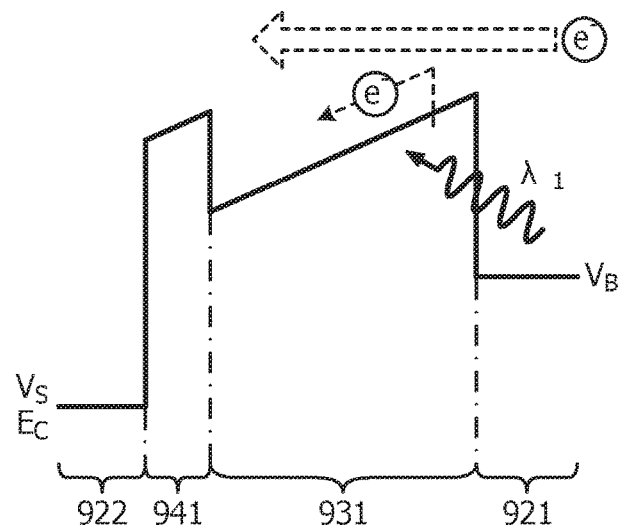
FIGS. 4A and 4B are first explanatory diagrams of the two-wavelength infrared photodetector including the barrier layers.

In the case where the two-wavelength infrared photodetector illustrated in FIG. 3 is ideally formed, as illustrated in FIG. 4A, electrons are excited into a conduction band in the first absorber layer 931 when infrared of a first wavelength is incident on the first absorber layer 931. Since there is a difference in electric potential between the middle contact layer 922 and the lower contact layer 921, the electrons excited into the conduction band flow to the middle contact layer 922, and the infrared of the first wavelength that is incident on the first absorber layer 931 is detected. The first barrier layer 941 is formed of a material having a large band gap between the first absorber layer 931 and the middle contact layer 922. Some carriers that are free of energy dissipation due to inelastic scattering cross the barrier layer. For this reason, the electrons are relatively easy to flow from the lower contact layer 921 to the middle contact layer 922.

Figure 4B:
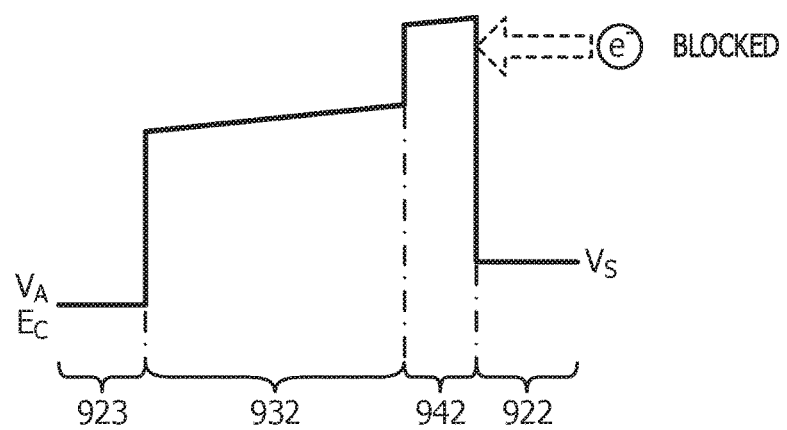

As illustrated in FIG. 4B, the second barrier layer 942 is formed of a material having a large band gap between the middle contact layer 922 and the second absorber layer 932. For this reason, the second barrier layer 942 blocks the electrons from flowing therein from the middle contact layer 922, and an electric current is unlikely to flow between the middle contact layer 922 and the upper contact layer 923.

Figure 5A:
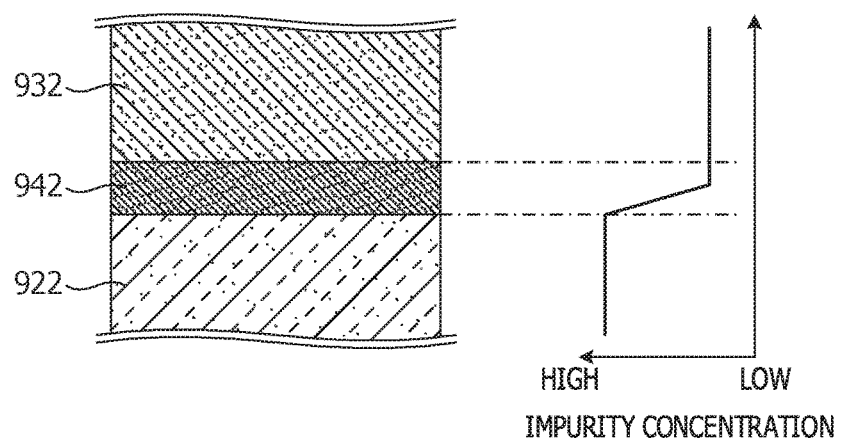
FIGS. 5A and 5B are second explanatory diagrams of the two-wavelength infrared photodetector including the barrier layers.
Figure 5B:
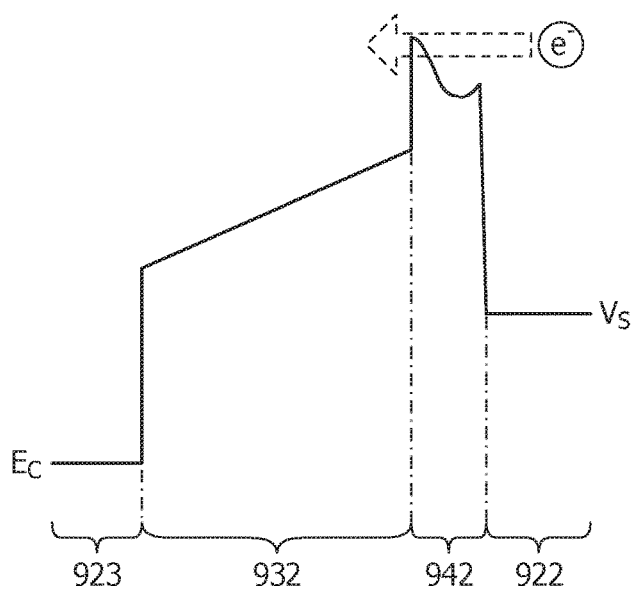

In the case where the second barrier layer 942 or another layer is formed by epitaxial growth, as illustrated in FIG. 5A, Si (silicon) with which the middle contact layer 922 is doped segregates to the second barrier layer 942, which is not doped with impurity elements. The segregation of Si impurity elements into the second barrier layer 942 partially decreases the conduction band and makes the electrons likely to flow through the second barrier layer 942, and a small amount of electric current flows between the upper contact layer 923 and the middle contact layer 922 and becomes a noise. The second barrier layer 942 is described above in the case where light is detected in the first absorber layer 931. The same is true for the first barrier layer 941 in the case where light is detected in the second absorber layer 932.

Photodetector

A two-wavelength infrared photodetector that is a photodetector according to a first embodiment will now be described with reference to FIG. 6. In the description, light means light including visible light, infrared, and ultraviolet.

The two-wavelength infrared photodetector according to the first embodiment reduces electrons that move from the middle contact layer to the second barrier layer in the case where light is detected in the first absorber layer, and reduces electrons that move from the middle contact layer to the first barrier layer in the case where light is detected in the second absorber layer. Consequently, signals of two wavelengths may be stably separated.

In a two-wavelength infrared photodetector 100 according to the first embodiment, compound semiconductors are formed on a GaAs substrate 10 by being epitaxially grown by using, for example, a molecular beam epitaxy (MBE) method. Specifically, a lower contact layer 21, a first absorber layer 31, a first barrier layer 41, a first buffer layer 141, an middle contact layer 22, a second buffer layer 142, a second barrier layer 42, a second absorber layer 32, and an upper contact layer 23 are formed so as to be stacked on the GaAs substrate 10. A coupler layer 24 is formed on the upper contact layer 23. A diffraction grating is formed on a surface of the coupler layer 24, so that an optical coupling structure is formed.

The lower contact layer 21, the middle contact layer 22, and the upper contact layer 23 are each formed of an n-GaAs layer in which GaAs is doped with Si, as n-type impurity elements, in a concentration of $1\times10^{18}$ cm$^{-3}$.

The first absorber layer 31 and the second absorber layer 32 each have a multi-quantum well (MQW) structures. The first absorber layer 31 and the second absorber layer 32 are formed so as to be able to detect infrared of different wavelengths. Specifically, the first absorber layer 31 is formed in a manner in which an $Al_{0.3}Ga_{0.7}As$ layer having a thickness of about 30 nm and an $In_{0.3}Ga_{0.7}As$ well layer having a thickness of about 2.5 nm are alternately formed. The second absorber layer 32 is formed in a manner in which an $Al_{0.26}Ga_{0.74}As$ layer having a thickness of about 30 nm and a GaAs well layer having a thickness of about 5 nm are alternately formed. Accordingly, infrared of a wavelength of 3 µm to 5 µm is detected in the first absorber layer 31, and infrared of a wavelength of 8 µm to 12 µm is detected in the second absorber layer 32.

The first barrier layer 41 and the second barrier layer 42 are each formed of an $i-Al_{0.35}Ga_{0.65}As$ layer having a thickness of about 50 nm and are not doped with impurity elements. The first buffer layer 141 and the second buffer layer 142 are each formed of an i-GaAs layer having a thickness of no less than 5 nm and no more than 20 nm and are not doped with impurity elements.

Pixels 101 are separated from each other in a manner in which grooves 102 are formed. The grooves 102 are formed in a manner in which the coupler layer 24, the upper contact layer 23, the second absorber layer 32, the second barrier layer 42, the second buffer layer 142, the middle contact layer 22, the first buffer layer 141, the first barrier layer 41, and the first absorber layer 31 are removed. Part of a surface of the lower contact layer 21, the side surfaces of each pixel 101, and part of the upper surface of the coupler layer 24 are covered by passivation films 50.

In each pixel 101, a wiring line 61 connected to the middle contact layer 22 is formed on the corresponding passivation film 50. The lower contact layer 21 forms a first common electrode and is connected to a wiring line 62 formed on the corresponding passivation film 50. The upper contact layer 23 of each pixel 101 is connected to a wiring line 63 formed on the corresponding passivation film 50 with the coupler layer 24 interposed therebetween and forms a second common electrode. In FIG. 6, each wiring line 61 corresponds to a middle electrode, the wiring line 62 corresponds to a lower electrode, and each wiring line 63 corresponds to an upper electrode.

The two-wavelength infrared photodetector is connected to a drive circuit 80 with bumps 71, 72, and 73 interposed therebetween. The wiring line 61 connected to the middle contact layer 22 formed in each pixel 101 is connected to a transistor 81 of the drive circuit 80 with the bump 71 interposed therebetween. The wiring line 62 connected to the lower contact layer 21 is connected to the electric potential $V_B$ of the drive circuit 80 with the bump 72 interposed therebetween. The wiring line 63 connected to the upper contact layer 23 with the coupler layer 24 interposed therebetween is connected to the electric potential $V_A$ of the drive circuit 80 with the bump 73 interposed therebetween.

Figure 7:
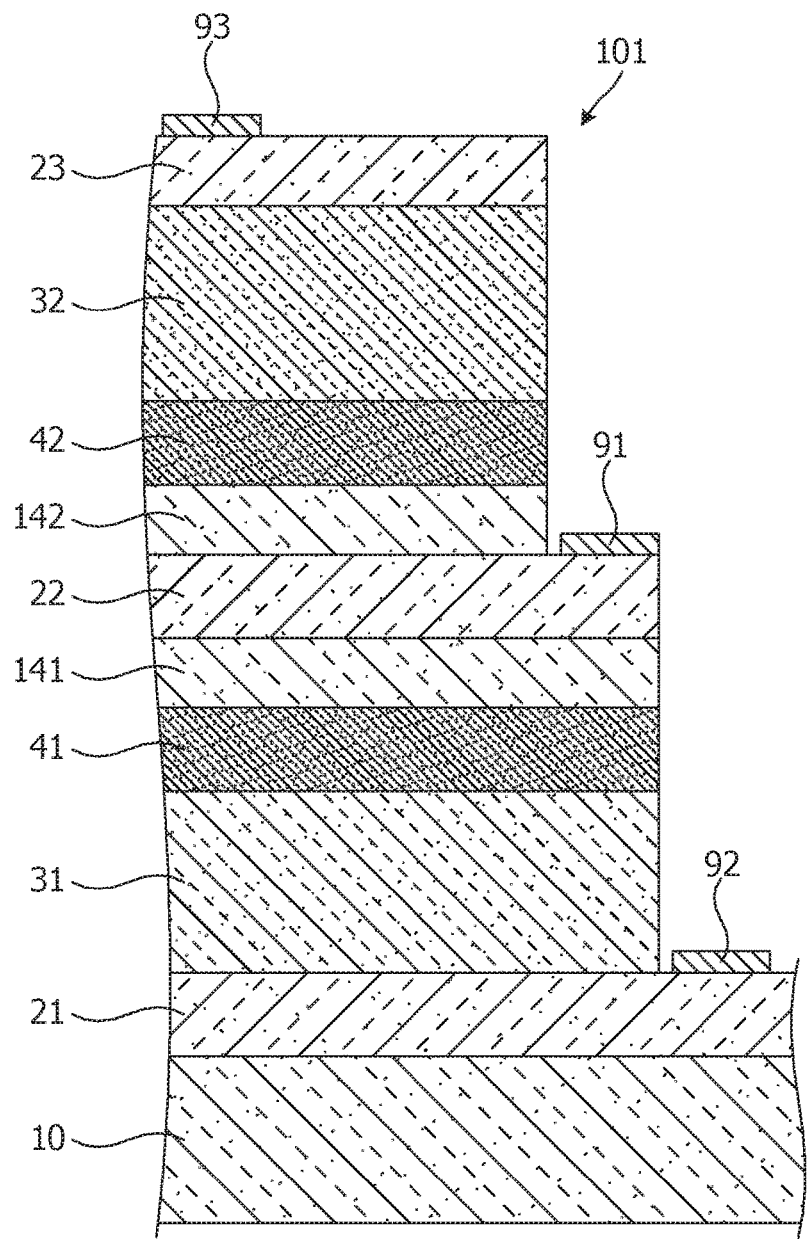
FIG. 7 is an explanatory diagram of the two-wavelength infrared photodetector according to the first embodiment.
Figure 8A:
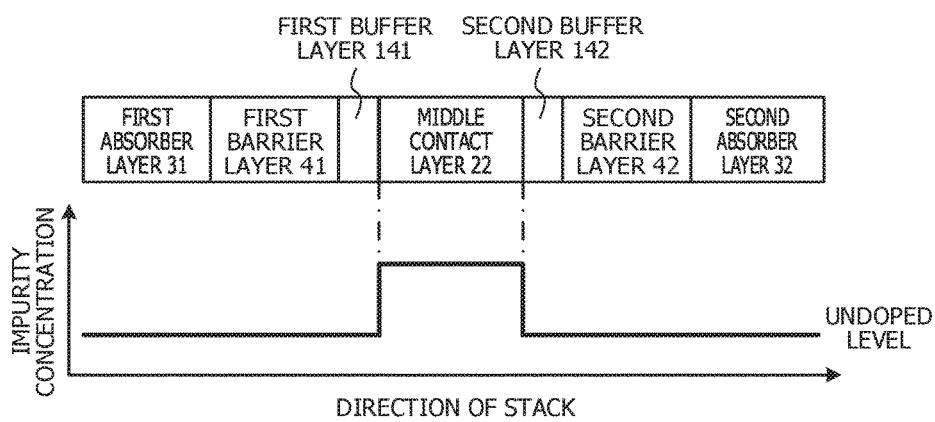
FIGS. 8A and 8B are first explanatory diagrams of the concentration of doped impurity elements.
Figure 8B:
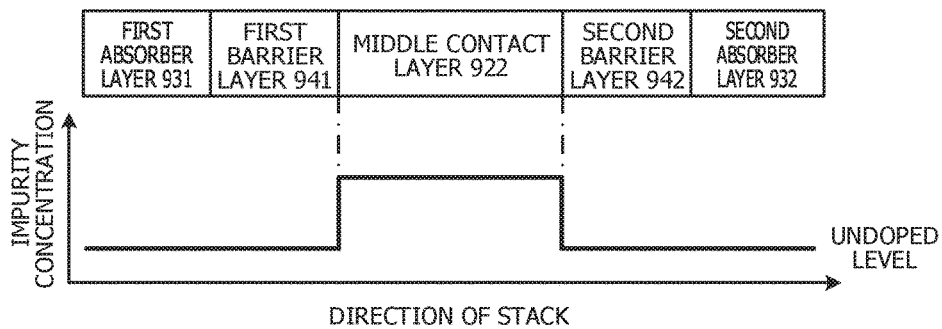

FIG. 7 schematically illustrates the structure of one of the pixels 101 of the two-wavelength infrared photodetector according to the first embodiment. In FIG. 7, a middle electrode 91 is formed on the middle contact layer 22, a lower electrode 92 is formed on the lower contact layer 21, and an upper electrode 93 is formed on the upper contact layer 23. FIG. 8A illustrates the concentration of doped impurities in the two-wavelength infrared photodetector according to the first embodiment. FIG. 8B illustrates the concentration of doped impurities in the two-wavelength infrared photodetector having the structure illustrated in FIG. 3.

According to the first embodiment, as illustrated in FIG. 8A, the first barrier layer 41, the second barrier layer 42, the first buffer layer 141, and the second buffer layer 142 are not doped with impurity elements, and the concentration of impurity elements thereof is $1\times10^{16}$ cm$^{-3}$ or less. Accordingly, the impurity concentration of these layers is lower than the impurity concentration of the middle contact layer 22. The first barrier layer 41 and the second barrier layer 42 are each formed of a material having a band gap larger than the band gap of the first buffer layer 141, the second buffer layer 142, and the middle contact layer 22. The first buffer layer 141 and the second buffer layer 142 are each formed of an i-GaAs layer. The middle contact layer 22 is formed of an n-GaAs layer, that is, is formed of a GaAs layer as in the first buffer layer 141 and the second buffer layer 142. Accordingly, the band gap of the middle contact layer 22 is equal to the band gap of the first buffer layer 141 and the second buffer layer 142.

In the case where the first buffer layer 141 is thus formed between the middle contact layer 22 and the first barrier layer 41, Si impurity elements with which the middle contact layer 22 is doped segregate to the first buffer layer 141 but do not segregate to the first barrier layer 41. Accordingly, the electrons that move from the middle contact layer 22 toward the first absorber layer 31 are blocked by the first barrier layer 41, into which the Si impurity elements do not segregate. Similarly, in the case where the second buffer layer 142 is formed between the middle contact layer 22 and the second barrier layer 42, the Si impurity elements with which the middle contact layer 22 is doped segregate to the second buffer layer 142 but do not segregate to the second barrier layer 42. Accordingly, the electrons that move from the middle contact layer 22 toward the second absorber layer 32 are blocked by the second barrier layer 42, into which the Si impurity elements do not disperse.

When the first barrier layer 41, the middle contact layer 22, the second barrier layer 42, and other layers are formed by epitaxial growth such as MBE, the Si impurity elements with which the middle contact layer 22 is doped segregate to a position of about 5 nm from the middle contact layer 22 in the thickness direction. Accordingly, the Si impurity elements with which the middle contact layer 22 is doped scarcely segregate to the first barrier layer 41 and the second barrier layer 42, provided that the thickness of the first buffer layer 141 and the second buffer layer 142 is 5 nm or more. The thickness of the first buffer layer 141 and the second buffer layer 142 is preferably 20 nm or less, and there is no advantage to increase the thickness so much.

Figure 9:
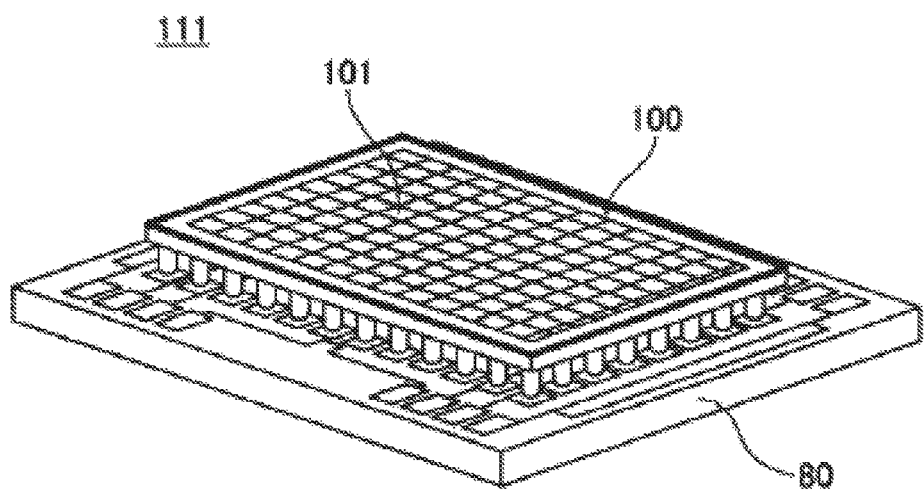
FIG. 9 is a perspective view of an infrared image sensor according to the first embodiment.

FIG. 9 is a perspective view of an infrared image sensor 111 in which the drive circuit 80 is connected to the two-wavelength infrared photodetector 100 according to the first embodiment. As illustrated in FIG. 9, the pixels 101 of the two-wavelength infrared photodetector 100 are formed in two dimensions, and the infrared image sensor 111 may take a two-dimensional image.

Figure 10:
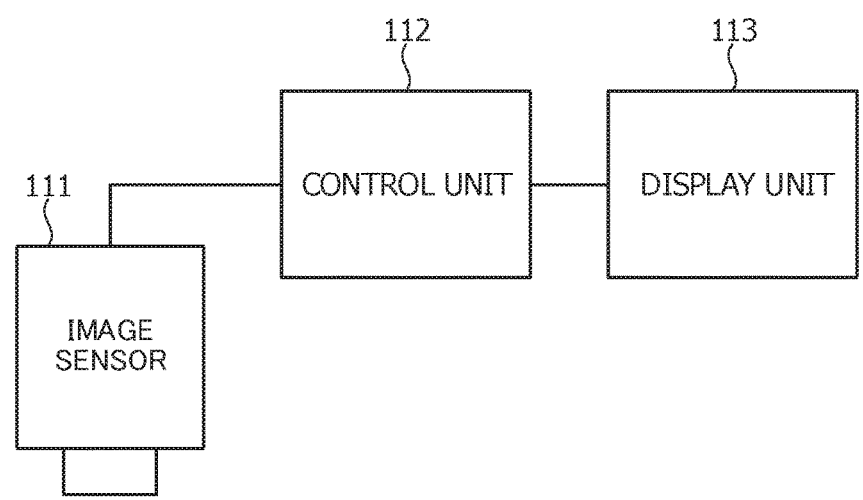
FIG. 10 is a block diagram of an infrared imaging device according to the first embodiment.

As illustrated in FIG. 10, in an infrared imaging device according to the first embodiment, a control unit 112 is connected to the infrared image sensor 111, and a display unit 113 is connected to the control unit 112. The control unit 112 performs a switching operation of two wavelengths to be detected by the infrared image sensor 111 and a signal operation of signals to be detected by the infrared image sensor 111. The display unit 113 is, for example, a display and displays a two-dimensional image based on the signals detected by the infrared image sensor 111.

The two-wavelength infrared photodetector according to the first embodiment may detect infrared of two wavelengths in a manner in which the time in which the first absorber layer 31 operates and time in which the second absorber layer 32 operates are divided.

Specifically, an electric potential difference is generated between the lower contact layer 21 and the middle contact layer 22, and the electric potential of the upper contact layer 23 and the electric potential of the middle contact layer 22 are made substantially equal. Alternatively, the electric potential of the upper contact layer 23 is made less than the electric potential of the middle contact layer 22 to such an extent that no electric current flows. Thus, carriers that have absorbed infrared of the first wavelength that is incident on the first absorber layer 31 are extracted from the middle contact layer 22. At this time, since the second barrier layer 42 containing no impurity elements is formed between the second absorber layer 32 and the middle contact layer 22, no carriers are extracted from the middle contact layer 22 even through infrared of a second wavelength is incident on the second absorber layer 32. In this way, optical signals only through the first absorber layer 31 may be detected.

An electric potential difference is generated between the upper contact layer 23 and the middle contact layer 22, and the electric potential of the lower contact layer 21 and the electric potential of the middle contact layer 22 are made substantially equal. Alternatively, the electric potential of the lower contact layer 21 is made less than the electric potential of the middle contact layer 22 to such an extent that no electric current flows. Thus, carriers that have absorbed infrared of the second wavelength that is incident on the second absorber layer 32 are extracted from the middle contact layer 22. At this time, since the first barrier layer 41 containing no impurity elements is formed between the first absorber layer 31 and the middle contact layer 22, no carriers are extracted from the middle contact layer 22 even through infrared of the first wavelength is incident on the first absorber layer 31. In this way, optical signals only through the second absorber layer 32 may be detected.

Figure 12A:
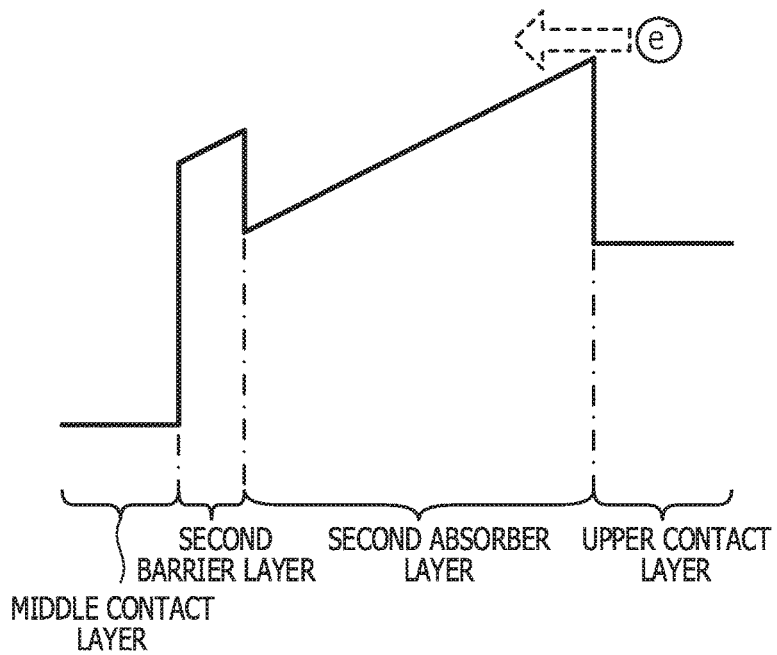
FIGS. 12A and 12B are explanatory diagrams of the voltage applied to the two-wavelength infrared photodetector.
Figure 12B:
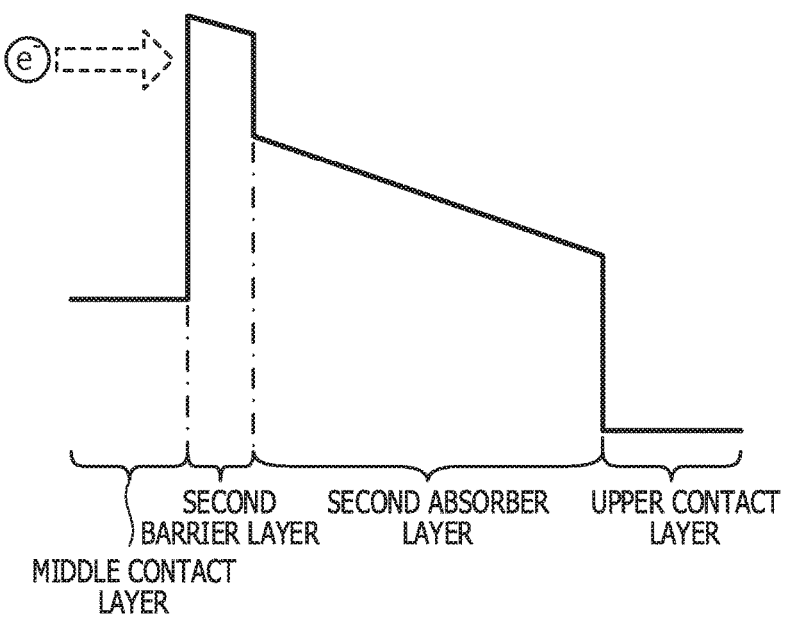

FIG. 11 illustrates the relationship between an applied voltage and a dark current in the case where the voltage applied between the upper contact layer and the middle contact layer of the two-wavelength infrared photodetector is changed. The value of the applied voltage is equal to the electric potential of the middle contact layer with respect to the electric potential of the upper contact layer. Accordingly, the conduction band in the case of a negative voltage applied as illustrated in FIG. 11 (operating direction) is illustrated in FIG. 12A, and the conduction band in the case of a positive voltage applied as illustrated in FIG. 11 (direction opposite to the operating direction) is illustrated in FIG. 12B. In FIGS. 12A and 12B, the second buffer layer is omitted.

In FIG. 11, a characteristic 11A represents the relationship of the two-wavelength infrared photodetector according to the first embodiment, and a characteristic 11B represents the relationship of the two-wavelength infrared photodetector having the structure illustrated in FIG. 3. In the case of the two-wavelength infrared photodetector according to the first embodiment illustrated by the characteristic 11A, the dark current in the direction of the positive voltage applied, that is, in the direction opposite to the operating direction may be lower than that in the case of the two-wavelength infrared photodetector illustrated by the characteristic 11B, which has the structure illustrated in FIG. 3. Signals of two wavelengths may be stably separated in a manner in which the dark current in the direction opposite to the operating direction is thus decreased.

Although the above description applies to the case where the compound semiconductors of the two-wavelength infrared photodetector are formed by MBE, the compound semiconductors may be formed by metal organic chemical vapor deposition (MOCVD). The carriers may be holes instead of the electrons. In the case where the carriers are holes, p-type impurity elements are doped instead of the n-type impurity elements. For example, Be may be used as the p-type impurity elements.

The materials of which the first absorber layer 31 and the second absorber layer 32 are formed may be selected optionally from the range of $Al_xGa_{1-x}As$ ($0<x\leq 1$) and $In_yGa_{1-y}As$ ($0<y\leq 1$). The first absorber layer 31 and the second absorber layer 32 may be each formed of quantum dots. In this case, the optical coupling structure such as the coupler layer may not be formed. The first absorber layer 31 and the second absorber layer 32 may include a combination of quantum wells and quantum dots.

The first barrier layer 41 may be formed between the lower contact layer 21 and the first absorber layer 31. The second barrier layer 42 may be formed between the upper contact layer 23 and the second absorber layer 32. In these cases, the first buffer layer 141, which is not doped with impurity elements, is preferably formed between the first barrier layer 41 and the lower contact layer 21, and the second buffer layer 142, which is not doped with impurity elements, is preferably formed between the second barrier layer 42 and the upper contact layer 23.

Only one of the first barrier layer 41 and the second barrier layer 42 may be formed. In this case, only one of the first buffer layer 141 and the second buffer layer 142 corresponding to the first barrier layer 41 or the second barrier layer 42 is formed.

Method of Manufacturing Photodetector

A method of manufacturing the two-wavelength infrared photodetector that is the photodetector according to the first embodiment will now be described with reference to FIG. 13A to FIG. 18B. For convenience, the detailed structure of part of the two-wavelength infrared photodetector described below is different from that of the two-wavelength infrared photodetector illustrated in, for example, FIG. 6. According to the first embodiment, the compound semiconductors are formed by being epitaxially grown by using MBE.

As illustrated in FIG. 13A, an i-GaAs buffer layer 11, an InGaP stopper layer 12, and the lower contact layer 21 are first formed on and above the GaAs substrate 10. A semi-passivation GaAs substrate whose main surface is a (100) surface is used as the GaAs substrate 10. Specifically, the GaAs substrate 10 is placed in a substrate introduction chamber of an MBE apparatus. The GaAs substrate 10 is heated to, for example, 400° C. for degassing in a preparation chamber of the MBE apparatus. Subsequently, the GaAs substrate 10 is transferred to a growth chamber in an ultra-high vacuum state of a vacuum of $10^{-10}$ Torr or less and heated to, for example, 640° C. under As pressures in order to remove a native oxide on the surface of the GaAs substrate 10. Subsequently, the temperature of the substrate is adjusted to be, for example, 600° C., and the i-GaAs buffer layer 11 having a thickness of, for example, 100 nm is formed on the GaAs substrate 10 in order to smooth the surface. Subsequently, the InGaP stopper layer 12 whose lattice matches that of GaAs is formed on the i-GaAs buffer layer 11 so as to have a thickness of about 300 nm. Subsequently, the lower contact layer 21 is formed on the InGaP stopper layer 12. The lower contact layer 21 is formed of n-GaAs that is doped with Si impurity elements at a concentration of, for example, $1 \times 10^{18}$ cm$^{-3}$ and that has a thickness of 1000 nm.

Subsequently, as illustrated in FIG. 13B, the first absorber layer 31 is formed on the lower contact layer 21. The first absorber layer 31 is a layer for detecting infrared of the first wavelength and has multi-quantum well structures. Specifically, the temperature of the substrate is adjusted to be, for example, 500° C., an $Al_{0.3}Ga_{0.7}As$ layer having a thickness of about 30 nm and an $In_{0.3}Ga_{0.7}As$ well layer having a thickness of about 2.5 nm and an electron concentration of $5 \times 10^{18}$ cm$^{-3}$ are alternately formed repeatedly 10 to 15 times. The first absorber layer 31 is formed such that the first layer and the last layer are the $Al_{0.3}Ga_{0.7}As$ layers.

Figure 14B:
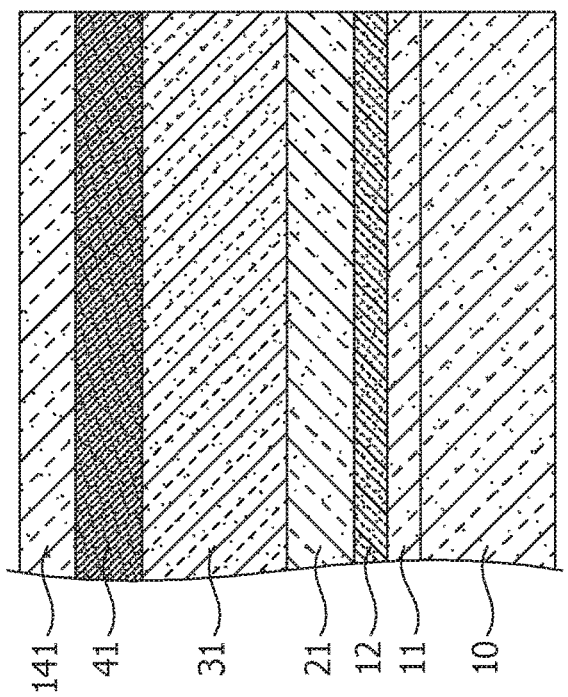
FIGS. 14A and 14B are second process diagrams of the method of manufacturing the semiconductor device according to the first embodiment.
Figure 14A:
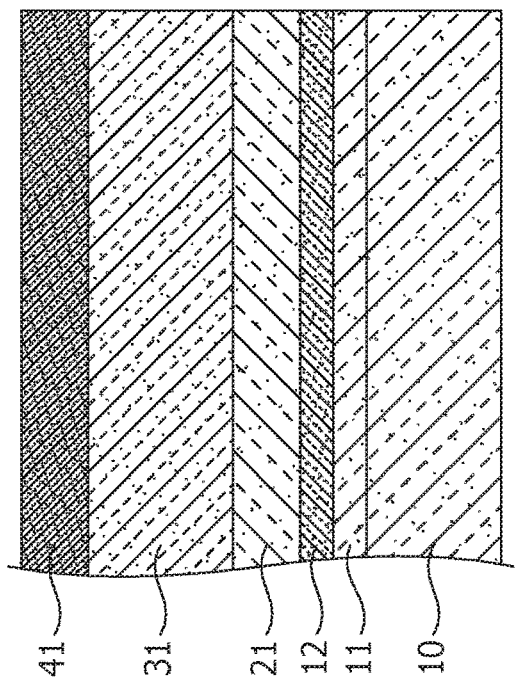

Subsequently, as illustrated in FIG. 14A, the first barrier layer 41 is formed on the first absorber layer 31. The first barrier layer 41 is formed of, for example, an $Al_{0.35}Ga_{0.65}As$ layer having a thickness is about 50 nm.

Subsequently, as illustrated in FIG. 14B, the first buffer layer 141 is formed on the first barrier layer 41. The first buffer layer 141 is not doped with impurity elements and is formed of an i-GaAs layer having a thickness is about 5 nm.

Figure 15A:
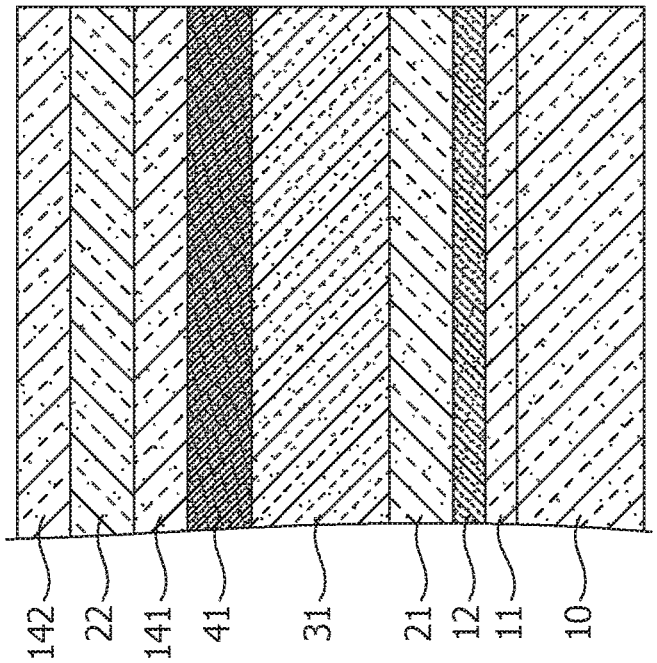
FIGS. 15A and 15B are third process diagrams of the method of manufacturing the semiconductor device according to the first embodiment.

Subsequently, as illustrated in FIG. 15A, the middle contact layer 22 is formed on the first buffer layer 141. The middle contact layer 22 is doped with Si impurity elements at an impurity concentration of $1 \times 10^{18}$ cm$^{-3}$ and is formed of an n-GaAs layer having a thickness is 1000 nm.

Figure 15B:
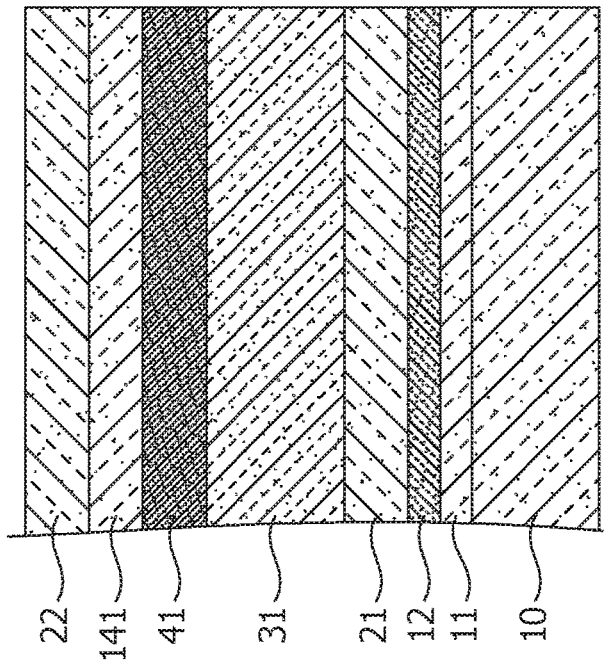

Subsequently, as illustrated in FIG. 15B, the second buffer layer 142 is formed on the middle contact layer 22. The second buffer layer 142 is not doped with impurity elements and is formed of an i-GaAs layer having a thickness of about 5 nm. The first buffer layer 141, the middle contact layer 22, and the second buffer layer 142 are continuously formed, and doping of Si may be easily controlled by an opening or closing operation of a shutter of a Si cell of the MBE apparatus.

Figure 16B:
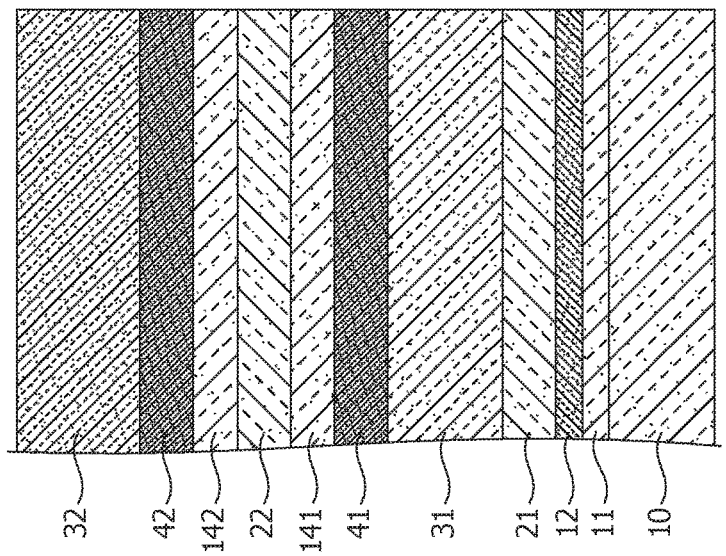
FIGS. 16A and 16B are fourth process diagrams of the method of manufacturing the semiconductor device according to the first embodiment.
Figure 16A:
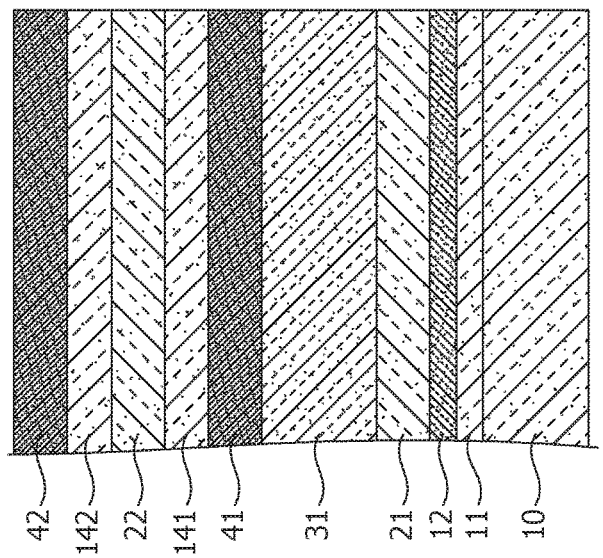

Subsequently, as illustrated in FIG. 16A, the second barrier layer 42 is formed on the second buffer layer 142. The second barrier layer 42 is formed of, for example, an $Al_{0.35}Ga_{0.65}As$ layer having a thickness of about 50 nm. The second buffer layer 142 is not doped with impurity elements and is formed of an i-GaAs layer having a thickness is about 5 nm.

Subsequently, as illustrated in FIG. 16B, the second absorber layer 32 is formed on the second barrier layer 42. The second absorber layer 32 is a layer for detecting infrared of the second wavelength and has multi-quantum well structures. Specifically, an $Al_{0.26}Ga_{0.74}As$ layer having a thickness of about 40 nm and a GaAs well layer having a thickness of about 5 nm and an electron concentration of $4 \times 10^{17}$ cm$^{-3}$ are alternately formed repeatedly about 50 times. The second absorber layer 32 is formed such that the first layer and the last layer are the $Al_{0.26}Ga_{0.74}As$ layers.

Subsequently, as illustrated in FIG. 17A, the upper contact layer 23 and a semiconductor layer 24a are formed on and above the second absorber layer 32. The upper contact layer 23 is doped with Si impurity elements at an impurity concentration of $1 \times 10^{18}$ cm$^{-3}$ and is formed of an n-GaAs layer having a thickness of 150 nm. The semiconductor layer 24a is a layer for forming the coupler layer 24 and is formed of an i-$Al_{0.3}Ga_{0.7}As$ layer that is not doped with impurity elements and that has a thickness of about 5 nm and an i-GaAs layer that is not doped with impurity elements and that has a thickness of about 640 nm.

Subsequently, as illustrated in FIG. 17B, periodic irregularities 24b are formed on a surface of the semiconductor layer 24a to form the coupler structure 24.

Subsequently, as illustrated in FIG. 18A, the grooves 102 for separating the pixels 101 from each other are formed to expose part of a surface of the lower contact layer 21, the middle contact layer 22, and the upper contact layer 23.

Subsequently, as illustrated in FIG. 18B, the middle electrode 91 is formed on the middle contact layer 22 whose surface is exposed. The lower electrode 92 is formed on the lower contact layer 21. The upper electrode 93 is formed on the upper contact layer 23. The middle electrode 91, the lower electrode 92, and the upper electrode 93 are each formed of a metallic multilayer film obtained by stacking AuGe, Ni, and Au.

Through the above processes, the two-wavelength infrared photodetector according to the first embodiment may be manufactured.

Second Embodiment

A two-wavelength infrared photodetector that is a photodetector according to a second embodiment will now be described. In the two-wavelength infrared photodetector according to the second embodiment, the impurity concentration of the buffer layers is inclined.

Figure 19:
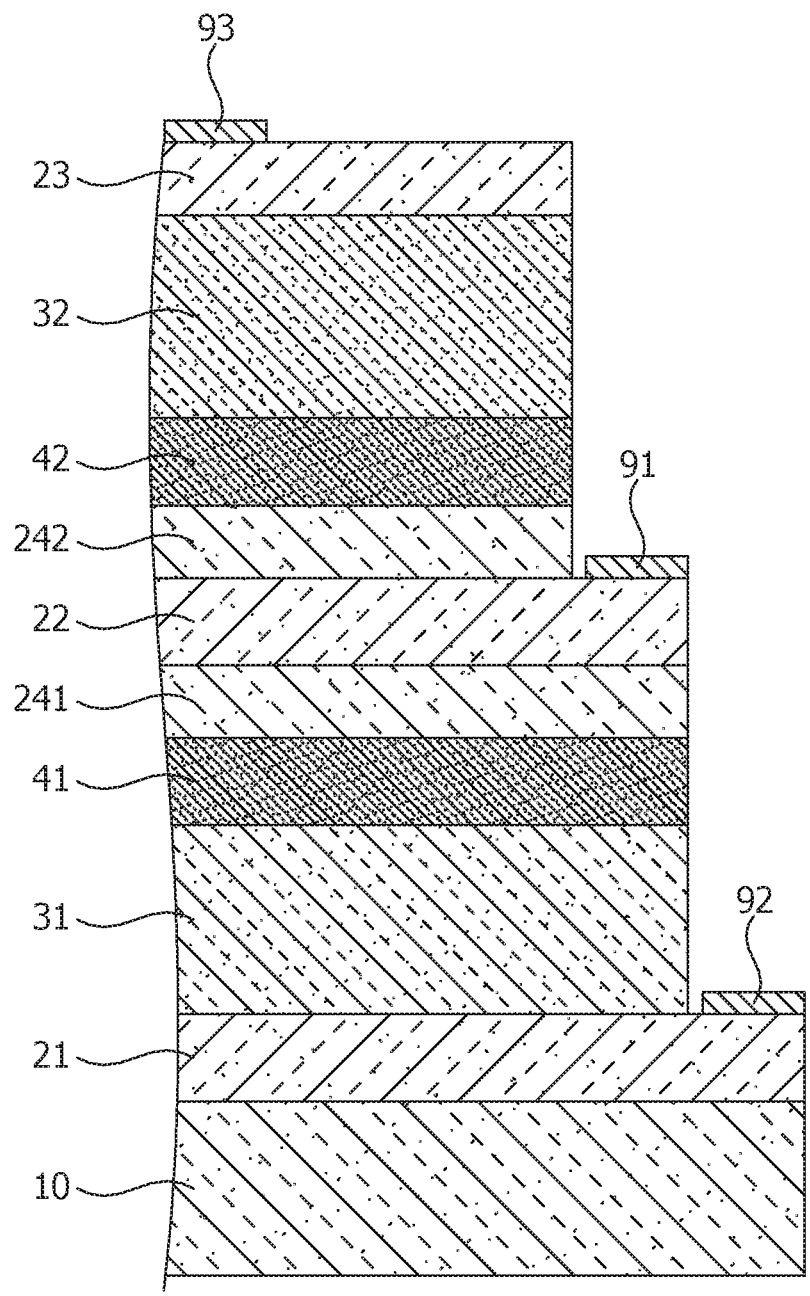
FIG. 19 is an explanatory diagram of a two-wavelength infrared photodetector according to a second embodiment.

As illustrated in FIG. 19, the two-wavelength infrared photodetector according to the second embodiment is formed in a manner in which compound semiconductors are epitaxially grown on and above the GaAs substrate 10 by, for example, MBE. Specifically, the lower contact layer 21, the first absorber layer 31, the first barrier layer 41, a first buffer layer 241, the middle contact layer 22, a second buffer layer 242, the second barrier layer 42, the second absorber layer 32, and the upper contact layer 23 are formed so as to be stacked on the GaAs substrate 10. A coupler layer having a surface on which a diffraction grating is formed may be formed on the upper contact layer 23.

Figure 20A:
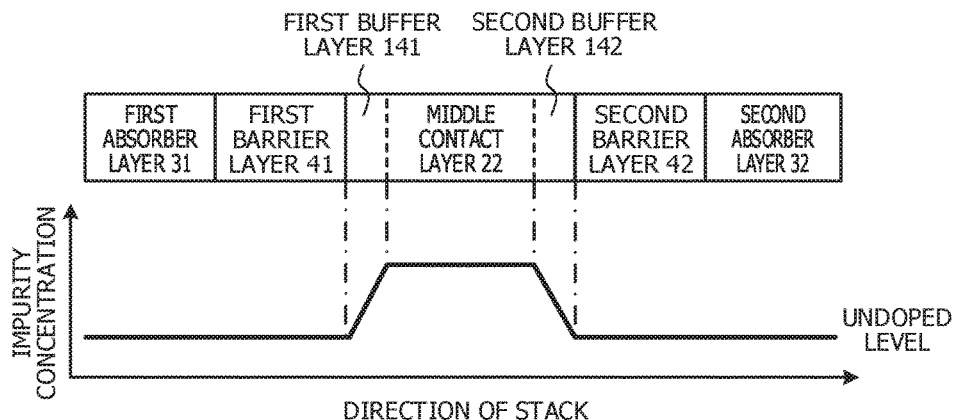
FIGS. 20A and 20B are second explanatory diagrams of the concentration of doped impurity elements.

As illustrated in FIG. 20A, in the two-wavelength infrared photodetector according to the second embodiment, the concentration of the Si impurity elements of the first buffer layer 241 gradually decreases from the side of the middle contact layer 22 toward the side of the first barrier layer 41. Specifically, the Si concentration of the first buffer layer 241 is $1 \times 10^{18}$ cm$^{-3}$ at a portion in contact with the middle contact layer 22, gradually decreases toward the first barrier layer 41, and is $1 \times 10^{16}$ cm$^{-3}$ or less at a portion in contact with the first barrier layer 41. Similarly, the concentration of the Si impurity elements of the second buffer layer 242 gradually decreases from the side of the middle contact layer 22 toward the side of the second barrier layer 42. Specifically, the Si concentration of the second buffer layer 242 is $1 \times 10^{18}$ cm$^{-3}$ at a portion in contact with the middle contact layer 22, gradually decreases toward the second barrier layer 42, and is $1 \times 10^{16}$ cm$^{-3}$ or less at a portion in contact with the second barrier layer 42.

Figure 20B:
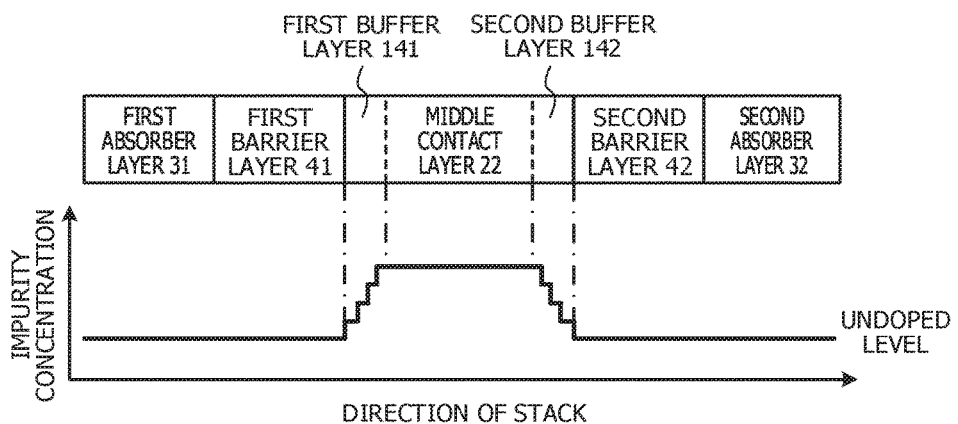

As illustrated in FIG. 20B, in the two-wavelength infrared photodetector according to the second embodiment, the Si concentration of the first buffer layer 241 and the second buffer layer 242 may decrease stepwise.

The other subject matter of the second embodiment other than the above description is the same as that of the first embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A photodetector, comprising:
a lower contact layer;
a first absorber layer that is formed over the lower contact layer and that is photosensitive to light of a first wavelength;
a middle contact layer formed over the first absorber layer;
a second absorber layer that is formed over the middle contact layer and that is photosensitive to light of a second wavelength; and
an upper contact layer formed over the second absorber layer,
wherein a barrier layer is formed between the lower contact layer and the first absorber layer, between the first absorber layer and the middle contact layer, between the middle contact layer and the second absorber layer, or between the second absorber layer and the upper contact layer,
wherein a buffer layer is formed between the lower contact layer and the barrier layer, between the middle contact layer and the barrier layer, or between the upper contact layer and the barrier layer,
wherein semiconductor materials of the lower contact layer, the middle contact layer, and the upper contact layer are doped with an impurity element,
wherein the barrier layer is formed of a material having a band gap larger than a band gap of the first absorber layer or a band gap of the second absorber layer, and
wherein an impurity concentration of the buffer layer is lower than an impurity concentration of the middle contact layer.

2. The photodetector according to claim 1,
wherein a first barrier layer is formed between the first absorber layer and the middle contact layer,
wherein a second barrier layer is formed between the second absorber layer and the middle contact layer,
wherein a first buffer layer is formed between the first barrier layer and the middle contact layer,
wherein a second buffer layer is formed between the second barrier layer and the middle contact layer,
wherein the first barrier layer is formed of a material having a band gap larger than the band gap of the first absorber layer,
wherein the second barrier layer is formed of a material having a band gap larger than the band gap of the second absorber layer, and
wherein an impurity concentration of the first buffer layer and an impurity concentration of the second buffer layer are lower than the impurity concentration of the middle contact layer.

3. The photodetector according to claim 2,
wherein the impurity concentration of the middle contact layer is $1 \times 10^{18}$ cm$^{-3}$ or more, and
wherein the impurity concentration of the first buffer layer and the impurity concentration of the second buffer layer are lower than $1 \times 10^{18}$ cm$^{-3}$.

4. The photodetector according to claim 2,
wherein a thickness of the first buffer layer and a thickness of the second buffer layer are 5 nm or more.

5. The photodetector according to claim 4,
wherein the thickness of the first buffer layer and the thickness of the second buffer layer are 20 nm or less.

6. The photodetector according to claim 2,
wherein a band gap of the middle contact layer is equal to a band gap of the first buffer layer and a band gap of the second buffer layer.

7. The photodetector according to claim 2,
wherein the middle contact layer is formed of a material containing n-GaAs, and
wherein the first buffer layer and the second buffer layer are each formed of a material containing i-GaAs.

8. The photodetector according to claim 2,
wherein the impurity concentration of the first buffer layer decreases from a side of the middle contact layer toward a side of the first absorber layer, and
wherein the impurity concentration of the second buffer layer decreases from the side of the middle contact layer toward a side of the second absorber layer.

9. The photodetector according to claim 1,
wherein a lower electrode is connected to the lower contact layer,
wherein an middle electrode is connected to the middle contact layer, and
wherein an upper electrode is connected to the upper contact layer.

10. The photodetector according to claim 1,
wherein the impurity element is silicon.

11. The photodetector according to claim 1,
wherein the photodetector is a two-wavelength infrared photodetector, and
wherein the light of the first wavelength and the light of the second wavelength are infrared of different wavelengths.

12. The photodetector according to claim 1,
wherein the first absorber layer and the second absorber layer each include a quantum well or a quantum dot.

13. An imaging device comprising:
a plurality of pixels arranged in two dimensions,
wherein each of the plurality of pixels includes a photodetector,
wherein the photodetector includes a lower contact layer, a first absorber layer that is formed over the lower contact layer and that is photosensitive to light of a first wavelength, a middle contact layer formed over the first absorber layer, a second absorber layer that is formed over the middle contact layer and that is photosensitive to light of a second wavelength, and an upper contact layer formed over the second absorber layer,
wherein a barrier layer is formed between the lower contact layer and the first absorber layer, between the first absorber layer and the middle contact layer, between the middle contact layer and the second absorber layer, or between the second absorber layer and the upper contact layer,
wherein a buffer layer is formed between the lower contact layer and the barrier layer, between the middle contact layer and the barrier layer, or between the upper contact layer and the barrier layer,
wherein semiconductor materials of the lower contact layer, the middle contact layer, and the upper contact layer are doped with an impurity element, wherein the barrier layer is formed of a material having a band gap larger than a band gap of the first absorber layer or a band gap of the second absorber layer, and wherein an impurity concentration of the buffer layer is lower than an impurity concentration of the middle contact layer.

\* \* \* \* \*